United States Patent
Bayerer et al.

(10) Patent No.: US 8,167,187 B2
(45) Date of Patent: May 1, 2012

(54) METHOD AND DEVICE FOR PRODUCING A BONDABLE AREA REGION ON A CARRIER

(75) Inventors: Reinhold Bayerer, Warstein (DE); Thomas Licht, Warstein (DE); Alfred Kemper, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 411 days.

(21) Appl. No.: 11/415,399

(22) Filed: Apr. 28, 2006

(65) Prior Publication Data

US 2006/0261133 A1    Nov. 23, 2006

(30) Foreign Application Priority Data

Apr. 29, 2005   (DE) .................. 10 2005 020 087

(51) Int. Cl.
*B23K 1/06* (2006.01)

(52) U.S. Cl. ........................... 228/110.1; 228/1.1

(58) Field of Classification Search .............. 228/1.1, 228/4.5, 110.1, 180.5, 904
See application file for complete search history.

(56) References Cited

U.S. PATENT DOCUMENTS

| | | | | |
|---|---|---|---|---|
| 4,875,618 A | * | 10/1989 | Hasegawa et al. | 228/180.5 |
| 5,249,450 A | * | 10/1993 | Wood et al. | 72/359 |
| 5,497,545 A | * | 3/1996 | Watanabe et al. | 29/830 |
| 5,550,083 A | | 8/1996 | Koide et al. | |
| 5,660,319 A | | 8/1997 | Falcone et al. | |
| 6,354,479 B1 | * | 3/2002 | Reiber et al. | 228/4.5 |

FOREIGN PATENT DOCUMENTS

| JP | 2002 016168 A | | 1/2002 |
|---|---|---|---|
| JP | 2005093774 A | * | 4/2005 |

* cited by examiner

*Primary Examiner* — David Sample
*Assistant Examiner* — Megha Mehta
(74) *Attorney, Agent, or Firm* — Maginot, Moore & Beck

(57) ABSTRACT

A method and a device is provided for levelling an area region on the surface of a metal or metallization layer of a carrier. The area region is made planar by the action of a stamp or of a roller.

22 Claims, 3 Drawing Sheets

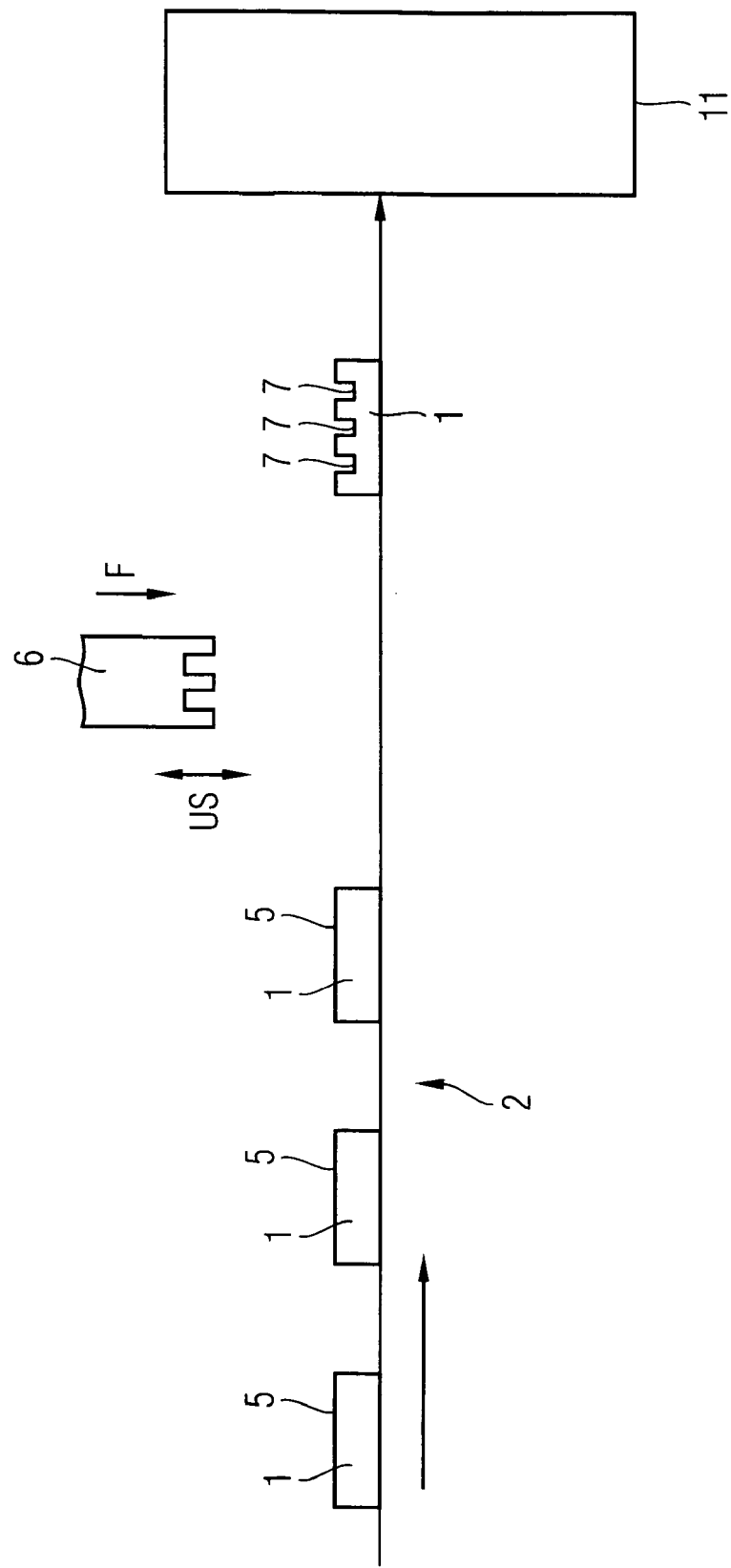

METHOD AND DEVICE FOR PRODUCING A BONDABLE AREA REGION ON A CARRIER

TECHNICAL FIELD

The present disclosure relates to a method and a device for producing a planar area region on the surface of a carrier for a semiconductor component, said carrier being provided with a metal layer.

BACKGROUND

Carriers for semiconductor components such as semiconductor chips, for example, in which integrated circuits may be realized, or else power semiconductor modules, are often connected thereto by means of thin wires. In this case, these thin wires are mechanically and electrically fitted with a metallization on the carrier by means of a bonding connection.

The thin wires that thus produce the electrical connections between the carrier and the semiconductor component have diameters of up to 100 μm. The metallization of the carriers has a specific surface roughness, which must not assume excessively large values, however, in order to be able to produce the bonding connections between the semiconductor component and the carrier with a high yield.

A "carrier" is understood for example to include substrates such as, in particular, so-called DCB substrates (DCB=Direct-Copper-Bonding), ceramic substrates, which are coated for example with a thick copper layer having a layer thickness of 50 μm to 1 mm, etc.

Without particular treatment, such carriers have a granular surface structure with considerable roughness after their production process. Such surfaces having a high degree of roughness are not suitable for thin wires for reliable bonding. The production of a suitable surface roughness in the case of these carriers generally requires a relatively high outlay. Furthermore, it should also be taken into consideration that on account of continuously advancing miniaturization, at the present time power semiconductor components are also being bonded with thin wires.

There is an additional and even greater problem for the mounting of semiconductor chips with thin liquid soldering layers or by means of deformable LTC low temperature connections on carriers. In this case, the liquid soldering layers or the deformable LTC layers on the carrier have a thickness of approximately 1 μm to 50 μm. A cohesive connection can be achieved only when the surface roughness of the carrier can still be filled with the solder of the soldering layer or the deformable layer from the LTC connection. Furthermore, it is endeavoured to mount semiconductor chips with integrated circuits onto DCB substrates.

In order to overcome the above difficulties, it has been taken into consideration hitherto to subject surfaces of carriers to an after-treatment by polishing by way of example. Such a procedure is relatively complex, however. Moreover, thought has already been given to employing only those carriers which, on account of their production process, have a sufficiently smooth surface for bonding connections with thin wires. However, carriers of this type are complex in terms of their production and thus expensive. For these reasons it has not been possible hitherto for example to bond chips with integrated circuits onto DCB substrates with ultrasonic wire ("US bonding").

SUMMARY

In order to address the shortcomings noted above, a method and a device according to at least some embodiments of the invention are provided with which, without a high outlay, carriers, such as, in particular DCB substrates, can be treated in such a way that thin wires can be US-bonded, for example, on them and chips can also be mounted on them.

A first embodiment of the invention is a method. The method includes pressing the area region onto the surface in planar fashion by the action of a tool.

A second embodiment of the invention is a device. The device comprises a tool, such as, in particular, a stamp or a roller, which can be pressed onto the surface of the carrier in such a way that the area region is configured in planar fashion there.

At least some embodiments of the invention make it possible to use any desired carriers with standard quality which do not have particular planarity of their surface. These carriers are pressed in planar fashion at least at locations provided for the bonding of thin wires or other mounting areas for chips, by the mechanical action of a tool, such as, in particular, a stamp or a roller. Therefore, such an area region is understood to mean surface locations of the carrier which are used for a bonding of a thin wire or alternatively for the mounting of a semiconductor chip.

By means of the tool, the surface of the carrier is impressed in the region of action of said tool practically in such planar fashion that the surface is pressed in by a few μm, as a result of which elevated regions are pressed down and the desired planar area region arises. During this action of the tool, the metal layer flows metallurgically at its surface.

During the action of the tool, that is to say of the stamp or roller, the carrier is supported by a support at its surface opposite to the tool, that is to say at its underside, so that the surface of the metal layer can be levelled by the tool. In order to achieve this levelling, the tool must have a greater hardness than the metal layer to be levelled.

It is particularly advantageous if the tool is exposed to ultrasound during its action on the surface of the metal layer. Such exposure to ultrasound facilitates the deformability of the surface of the metal layer.

In some embodiments, an area of application for the method and device described above is DCB substrates. The latter may be used for example for power semiconductor modules such as IPM's (IPM=Intelligent Power Module) with thin wire bonds and/or thin mounting layers. For this purpose a DCB substrate is levelled prior to the soldering-on or mounting of the respective semiconductor chips at least in the region of the bonding or mounting locations.

In this case, a continuous method to which the carriers or substrates are exposed is particularly advantageous for mass production. In this case, it is possible for a plurality of bonding locations to be levelled or impressed in one step by means of a single multiple tool, which may even also hold true for a plurality of substrates which are levelled jointly in any one method step.

By way of example, a steel plate may be used as a support for a carrier or else a plurality of substrates, the carriers being placed onto said steel plate. Such a steel plate reliably prevents the individual ceramics of the carriers from breaking.

Suitable materials for the tools, that is to say for example for a stamp or a roller, are tool steel or hard metals, in which case a hardened surface, in particular, should be present which may be refined for example with a layer made of TiN and/or CrN. Further suitable materials for the tools are tungsten carbide, titanium carbide, diamond-covered tungsten carbide, sintered ceramic materials, etc.

The tool itself should, as has already been mentioned, be exposed to ultrasound which deflects the tool perpendicularly or parallel to the surface of the carrier. In other words, longitudinal or transverse ultrasound waves which oscillate in the direction of action of the tool on the carrier are beneficial. An ultrasonic frequency of between 10 kHz and 150 kHz has proved to be particularly advantageous.

The above described features and advantages, as well as others, will become more readily apparent to those of ordinary skill in the art by reference to the following detailed description and accompanying drawings.

BRIEF DESCRIPTION OF THE DRAWINGS

FIG. 3 shows a schematic illustration of a device for simultaneously producing a plurality of levelled area regions according to a further exemplary embodiment of the invention.

DETAILED DESCRIPTION

In the figures, the same reference symbols are used in each case for mutually corresponding structural parts.

Figure 1A:
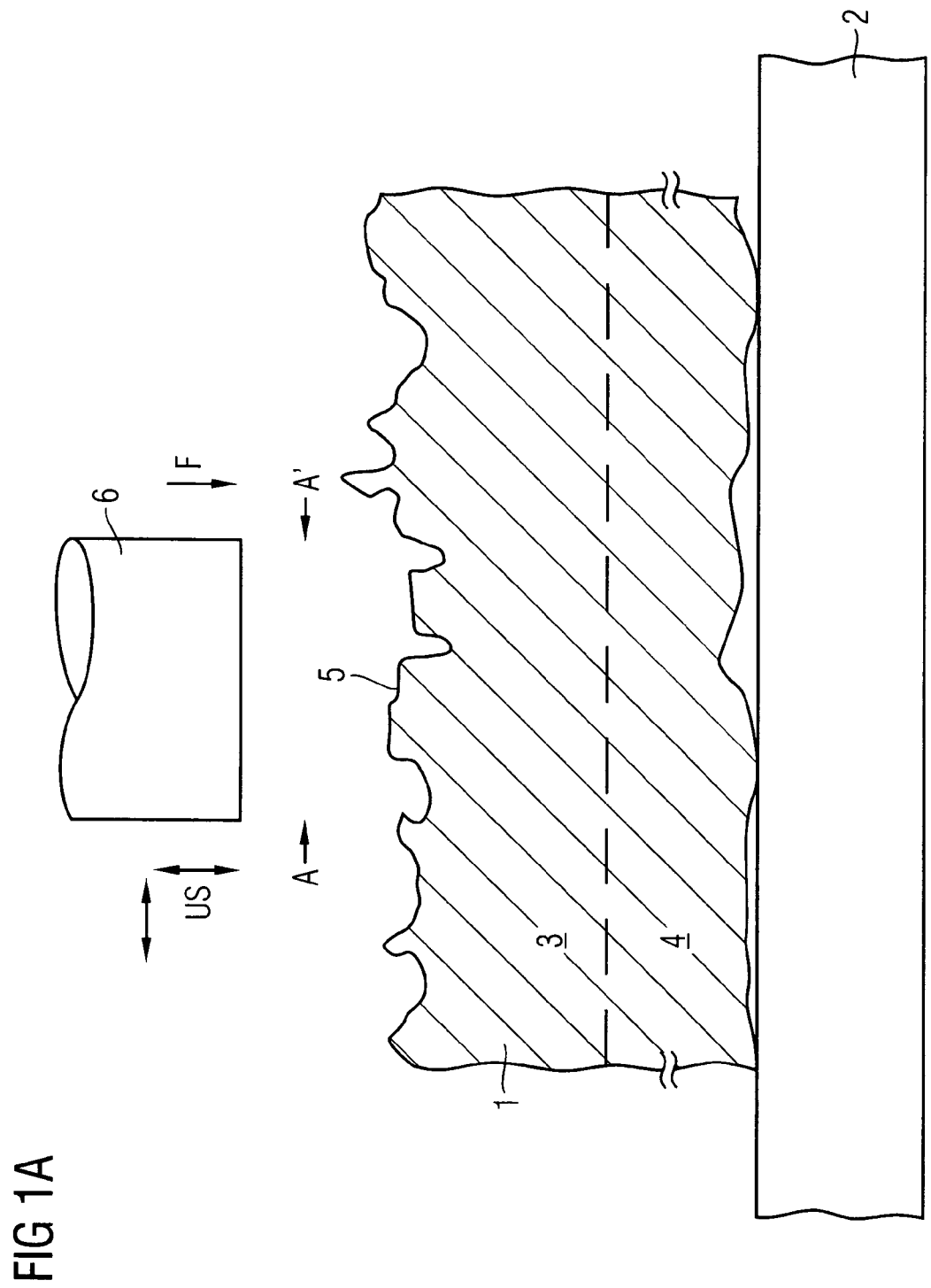
FIGS. 1A and 1B show a sectional illustration through a first exemplary embodiment of the invention.

FIG. 1A shows, in a sectional illustration, a carrier 1 lying on a fixed support 2, for example a steel plate, which carrier may be a DCB substrate. Said carrier 1 has a metal layer 3 applied on a substrate 4. The metal layer 3 may be composed of copper, by way of example, while ceramic is provided for the substrate 4 in order thus to form the aforementioned DCB substrate for the carrier 1.

Instead of copper, some other material such as, for example, gold, aluminium, etc. may also be used for the metal layer 3.

The layer thickness of the metal layer 3 can be set within wide limits. In the case of a DCB substrate, said layer thickness may for example lie between 50 μm and 1 mm. It goes without saying, however, that other values are also possible. Thus, by way of example, smaller layer thicknesses for instance in the range of 1 μm to 50 μm are provided for the mounting of semiconductor chips.

What is problematic is that upon close observation the surface 5 of the metal layer 3 that is opposite to the support 2 is not planar but rather has roughnesses having an extent in the region of μm. If the intention is then to effect bonding onto a specific area region AA' of this surface 5, that is to say to provide this region AA' with a bonding wire, the area region must meet specific planarity requirements in order to be able to ensure secure bonding. Without such planarity or with an excessively great surface roughness, bonding of a wire cannot be formed reliably. The same also applies to the mounting of semiconductor chips by means of thin soldering layers or LTC connections.

Figure 1B:
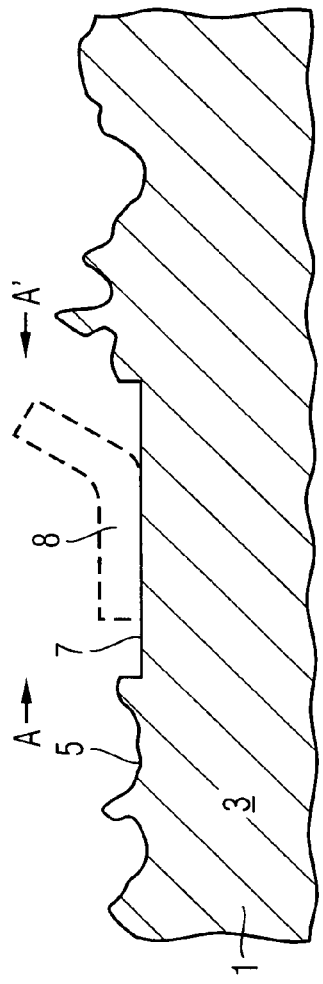

In order to be able to produce this high degree of planarity or low degree of surface roughness, a stamp 6 is provided, which can be lowered onto the surface 5 of the carrier 1 bearing on the support 2, in order to exert a pressure force F on said surface 5, so that, as is illustrated in FIG. 1B, an area region 7 of the surface 5 with a high degree of planarity or a low degree of surface roughness arises in the region AA'. It goes without saying that it is also possible for the stamp 6 to be configured in stationary fashion and in return for the support 2 to be embodied in movable fashion, so that said support with the carrier 1 bearing on it can be brought to the underside of the stamp 6, as a result of which the surface 5 presses against the underside of the stamp 6 in order to produce the planar area region 7.

The stamp 6 is preferably exposed to ultrasound US (cf. the two double arrows), with the result that longitudinal ultrasound waves which oscillate in the direction of the force F or perpendicularly thereto arise in the stamp 6. The ultrasound US thus deflects the stamp 6 perpendicularly to the surface 5 of the carrier 1. The ultrasonic frequency of the ultrasound US preferably lies in the range of between 10 kHz and 150 kHz but other frequencies are also possible.

The stamp 6 must be composed of a hard material which, in any event, is harder than the material of the metal layer 3. In advantageous embodiments, the stamp 6 may have a hardened surface which is refined, for example, with TiN, CrN, etc. The stamp 6 may be formed of any suitable material such as, for example, tungsten carbide, titanium carbide, diamond-covered tungsten carbide, sintered ceramic materials, etc.

A bonding wire 8 can readily be fitted on the planar area region 7, as is indicated by dashed lines in FIG. 1B.

Figure 2:
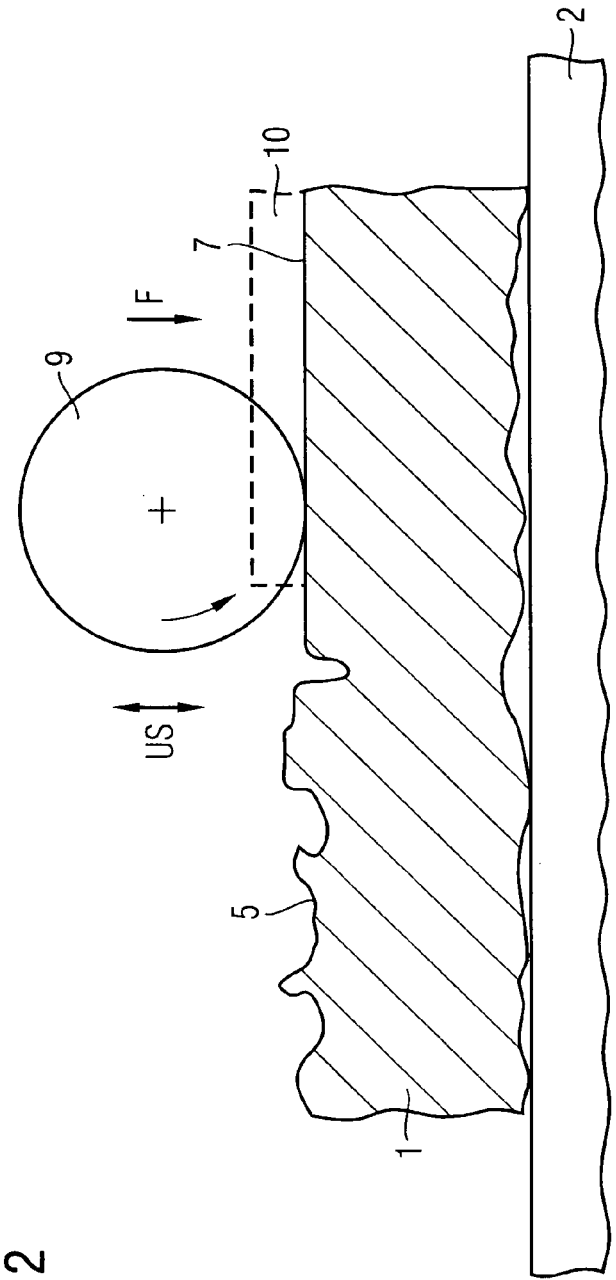
FIG. 2 shows a sectional illustration through a second exemplary embodiment of the invention.

FIG. 2 illustrates a further exemplary embodiment of the invention. In the case of this exemplary embodiment, a roller 9 is used instead of the stamp 6, which roller presses with a force F onto the surface 5 of a carrier 1 lying on a support 2 and in this case is exposed to ultrasound US like the stamp 6. A planar area region 7 is produced in this way and a semiconductor chip 10 (illustrated in dashed fashion) can be mounted on said area region after the roller 9 has been removed.

The same materials as for the stamp 6 can be used for the roller 9. Likewise, the ultrasound US for the roller 9 can be set in a frequency range corresponding to the frequency range for the stamp 6.

FIG. 3 shows a further exemplary embodiment of the invention, in the case of which a plurality of carriers 1 are guided through on a moving support 2 to a semiconductor-chip mounting location 11 in a continuous method and in the process are subjected to a treatment by a stamp 6. The underside of the stamp 6 that impresses the untreated surfaces 5 of the carriers 1 have a plurality of impressing areas, with the result that the surface 5 of each carrier 1 is subjected to a multiple treatment in which a plurality of area regions 7 are simultaneously made planar by an action of the stamp 6. While FIG. 3 illustrates a case in which three area regions 7 of a carrier 1 are levelled by means of a stamp 6, it is also possible for example for two carriers to be treated simultaneously by means of a stamp 6. That is to say that the stamp 6 then acts simultaneously on two closely adjacent carriers 1 in order to form the planar area regions 7 on said carriers.

What is claimed is:

1. A method for producing a semiconductor component, the method comprising:
   providing a carrier having a continuous single one-piece metal layer and a substrate extending over a top surface of the carrier, the continuous single one-piece metal layer being provided on the substrate and formed of a material selected from the group consisting of copper, gold, and aluminium, wherein the entire continuous single one-piece metal layer has a constant thickness between 50 μm and 1 mm over the top surface;
   pressing a tool onto a surface of the continuous single one-piece metal layer of the substrate to form a planar flat area region on less than all of the surface of the continuous single one-piece metal layer; and
   mounting a semiconductor chip of the semiconductor component or bonding a thin wire of the semiconductor chip onto the planar flat area region.

2. The method according to claim 1, wherein pressing the tool onto the surface of the metal layer of the substrate further comprises:

exposing the tool to ultrasound while pressing the tool onto the surface of the continuous single one-piece metal layer of the one-piece metal layer.

3. The method according to claim 2, wherein exposing the tool to ultrasound comprises:
exposing the tool to ultrasound comprising longitudinal or transverse ultrasound waves that deflect the tool substantially perpendicularly to the surface of the substrate.

4. The method according to claim 2, wherein exposing the tool to ultrasound comprises:
exposing the tool to ultrasound comprising longitudinal or transverse ultrasound waves having a frequency range between approximately 10 kHz and 150 kHz.

5. The method according to one of claim 1, wherein the tool is constructed of at least one selected from the group consisting of tungsten carbide, titanium carbide, diamond-covered tungsten carbide or a sintered ceramic material.

6. The method according to claim 1, wherein pressing the tool onto the surface of the continuous single one-piece metal layer of the substrate further comprises pressing a tool having a hardened surface.

7. The method according to claim 6, wherein the hardened surface of the tool is refined with a layer made of titanium nitride (TiN) or chromium nitride (CrN).

8. The method according to claim 1, wherein pressing the tool onto the surface of the continuous single one-piece metal layer of the substrate comprises:
pressing a stamp onto the surface of the continuous single one-piece metal layer of the substrate.

9. The method according to claim 1, wherein pressing the tool onto the surface of the continuous single one-piece metal layer of the substrate comprises:
pressing a roller onto the surface of the continuous single one-piece metal layer of the substrate.

10. The method according to claim 1, wherein the substrate is supported by a support at least by an underside opposite to the planar flat area region.

11. The method according to claim 1, wherein the substrate comprises a DCB substrate.

12. The method according to claim 1, wherein the substrate comprises a ceramic substrate.

13. The method according to claim 1, wherein pressing the tool onto the surface of the continuous single one-piece metal layer of the substrate to form the planar flat area region comprises:
pressing the tool such that a plurality of planar flat regions are simultaneously formed.

14. The method according to claim 13, wherein pressing the tool onto the surface of the continuous single one-piece metal layer of the substrate to form the planar flat area region further comprises:
pressing the tool simultaneously onto surfaces of the continuous single one-piece metal layers of a plurality of substrates to form a planar flat region on each of the plurality of substrates.

15. The method according to claim 1, wherein the continuous single one-piece metal layer includes a metallization layer.

16. The method according to claim 15, wherein the metallization layer has a thickness between approximately 50 μm to 1 mm.

17. A method for producing a semiconductor component, the method comprising:
providing a carrier having a substrate and a continuous single one-piece metal layer extending over a top surface of the substrate, the continuous single one-piece metal layer having a surface that is rough and non-planar, the continuous single one-piece metal layer being formed of a material selected from the group consisting of copper, gold, and aluminium, wherein the entire continuous single one-piece metal layer and has a constant thickness between 50 μm and 1 mm over the top surface of the substrate;
pressing a tool onto a first area of the surface of the continuous single one-piece metal layer, the first area of the surface being free of intentionally raised portions configured for use as electrical contacts, wherein
a planar flat region is formed on the surface of the continuous single one-piece metal layer after the tool is pressed onto the first area, the planar region having a higher degree of planarity than a remaining area of the surface that is rough and non-planar; and
connecting a semiconductor chip of the semiconductor component to the planar flat region.

18. The method of claim 17 wherein the step of connecting the semiconductor chip of the semiconductor component to the planar flat region comprises bonding a thin wire of the semiconductor chip onto the planar region.

19. The method of claim 17 wherein the step of connecting the semiconductor chip of the semiconductor component to the planar flat region comprises mounting the semiconductor chip onto the planar region.

20. The method according to claim 17, wherein pressing the tool onto the first area of the surface of the continuous single one-piece metal layer further comprises exposing the tool to ultrasound while pressing the tool onto the first area of the surface of the continuous single one-piece metal layer.

21. A method for producing a semiconductor component, the method comprising:
providing a carrier having a substrate and a continuous single one-piece metal layer extending over a top surface of the substrate, the continuous single one-piece metal layer having a surface that is rough and non-planar, the continuous single one-piece metal layer being formed of a material selected from the group consisting of copper, gold, and aluminium, wherein the entire continuous single metal one-piece layer has a constant thickness between 50 μm and 1 mm over the top surface of the substrate;
planarizing a first area of the surface of the continuous single one-piece metal layer without polishing by pressing a tool onto the first area of the surface of the continuous single one-piece metal layer to form a planar flat region, the planar flat region having a higher degree of planarity than the rough and non-planar surface; and
mounting a semiconductor chip of the semiconductor component or bonding a thin wire of the semiconductor chip onto the planar flat area region.

22. The method of claim 21 wherein the substrate comprises a DCB substrate or a ceramic substrate.

* * * * *